US008076658B2

(12) United States Patent
Vokurka (10) Patent No.: US 8,076,658 B2
(45) Date of Patent: Dec. 13, 2011

(54) ELECTRON BEAM PROCESSING DEVICE

(75) Inventor: Franz Vokurka, Dorf Tirol (IT)

(73) Assignee: Global Beam Technologies AG, Maisach (DE)

( * ) Notice: Subject to any disclaimer, the term of this patent is extended or adjusted under 35 U.S.C. 154(b) by 192 days.

(21) Appl. No.: 12/502,567

(22) Filed: Jul. 14, 2009

(65) Prior Publication Data

US 2010/0012860 A1   Jan. 21, 2010

(30) Foreign Application Priority Data

Jul. 17, 2008   (DE) .......................... 10 2008 033 615

(51) Int. Cl.
  *G21K 5/10*   (2006.01)
  *B23K 15/00*   (2006.01)
(52) U.S. Cl. ................................ 250/492.3; 219/121.22
(58) Field of Classification Search ............... 250/492.3, 250/441.11; 219/121.12–121.13, 72
  See application file for complete search history.

(56) References Cited

U.S. PATENT DOCUMENTS

| 3,424,891 A * | 1/1969 | Anderson et al. ......... 219/121.13 |
| 3,586,812 A * | 6/1971 | Fisher ............................. 219/72 |
| 3,588,442 A | 6/1971 | O'Riley |
| 4,040,089 A * | 8/1977 | Guarracini ................. 369/53.26 |
| 4,516,029 A * | 5/1985 | Tucker ..................... 250/442.11 |
| 5,700,988 A * | 12/1997 | Fournier .................. 219/121.13 |
| 2004/0084420 A1 | 5/2004 | Milburn |

FOREIGN PATENT DOCUMENTS

| DE | 1913699 | 10/1969 |
| DE | 1921226 | 11/1969 |
| DE | 3618283 A1 | 12/1987 |
| FR | 2372509 A1 | 6/1978 |
| JP | 50117125 U | 9/1975 |

OTHER PUBLICATIONS

Extended European Search Report for EP 09 008 404.

* cited by examiner

*Primary Examiner* — Jack Berman
*Assistant Examiner* — David E Smith
(74) *Attorney, Agent, or Firm* — J-TEK Law PLLC; Jeffrey D. Tekanic (57) ABSTRACT

An electron beam processing device includes a chamber housing that defines a chamber interior space and has a first opening. A carriage is movable along the first opening. An electron beam generator is disposed on the carriage so that the generated electron beam passes through the first opening when the carriage moves along the first opening. A disk is disposed between the chamber housing and the carriage and is rotatable about a rotational axis, which is perpendicular to the first opening, at least between a first rotational position and a second rotational position. The disk has a second opening spaced from the rotational axis of the disk in the radial direction. The rotational axis of the disk is disposed so that the first opening always overlaps the second opening at least along an electron beam propagation axis when the disk rotates between the first and second rotational positions.

20 Claims, 5 Drawing Sheets

PRIOR ART

Fig. 5

PRIOR ART

ELECTRON BEAM PROCESSING DEVICE

CROSS-REFERENCE

The present application claims priority to German patent application no. 10 2008 033 615.7 filed Jul. 17, 2008, the contents of which are fully incorporated herein by reference.

TECHNICAL FIELD

The invention relates to an electron beam processing device having a carriage system, which may be utilized in certain embodiments to weld workpieces under reduced pressure using an electron beam.

BACKGROUND ART

Electron beam processing, such as electron beam welding of workpieces, typically takes place in a chamber, in which retaining tools for the workpieces are disposed. The workpieces are loaded onto and unloaded from the retaining tools through a closeable and sealable opening of the chamber. The processing takes place under a vacuum or reduced pressure, because the energy density of the electron beam is significantly reduced even at short distances under standard atmospheric conditions.

Relative movements between the electron beam and the workpieces are required for welding and are generated outside of the chamber, e.g., by beam deflection or by moving an electron beam generator relative to the workpiece. In the latter case, the electron beam generator is mounted, e.g., on a longitudinal- or X-Y carriage system, which is moved by a motor.

Figure 4:
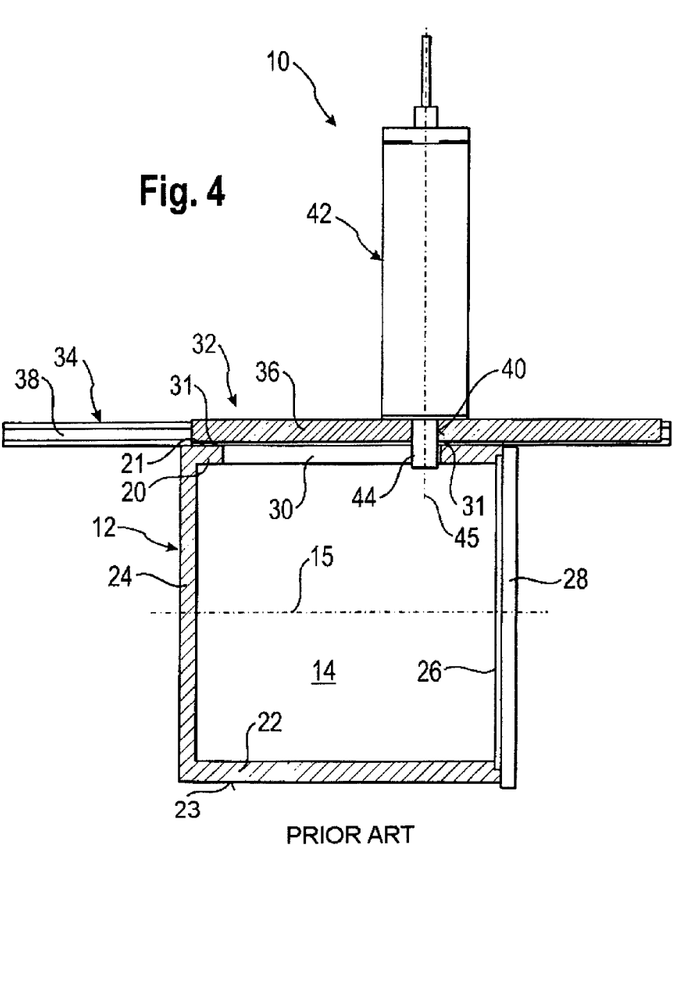
FIG. 4 shows a longitudinal view of a known electron beam processing device.
Figure 5:
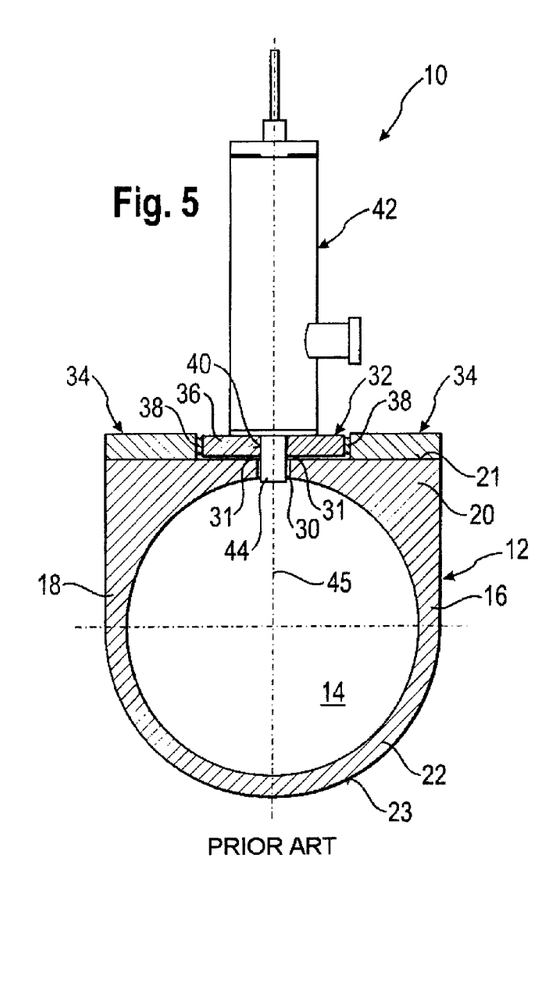
FIG. 5 shows a cross-sectional view of the known electron beam processing device of FIG. 4.

A chamber arrangement 10 of a known electron beam processing device having a carriage system is shown in FIGS. 4 and 5.

The chamber arrangement 10 includes a chamber housing 12. The chamber housing 12 defines a chamber interior space 14 having a circular cross-section perpendicular to a longitudinal axis 15 of the chamber housing 12 (see FIG. 5). Electron beam processing, such as e.g., electron beam welding of workpieces under vacuum or reduced pressure, takes place in the chamber housing 12. The chamber housing 12 has two mutually-opposing side walls 16, 18 (FIG. 5), an upper wall 20 having a planar upper side 21 extending in the horizontal direction in the view of FIG. 4, a lower wall 22 having a curved lower side 23, a planar rear wall 24 and a loading/unloading opening 26 disposed opposite of the rear wall 24. The side walls 16, 18 are connected with the rear wall 24, the upper wall 20 and the lower wall 22 in a pressure-tight manner. The upper wall 20 and the lower wall 22 mutually oppose each other and the rear wall 24 is disposed perpendicular to the upper wall 20 and the lower wall 22. The loading/unloading opening 26 is closeable in a sealed manner by a door 28. A (not-shown) seal is disposed around the edge of the loading/unloading opening 26, such that the seal is located between the edge of the loading/unloading opening 26 and the door 28 in the closed state.

A slot-shaped opening 30 is defined in the middle of the upper side 21 of the chamber housing 12. In this context, 'slot-shaped' is intended to encompass, but not be limited to, embodiments wherein the slot-shaped opening 30 is longer than it is wide, so that it has the shape of an elongated hole in a plan view. The slot-shaped opening 30 extends parallel to the longitudinal axis 15 of the chamber housing 12 and thus in a direction that extends perpendicular to the respective planes of the rear wall 24 and the loading/unloading opening 26.

As can be derived from the illustration of FIG. 4, the distance between the right-side edge of the slot-shaped opening 30 and the loading/unloading opening 26 is approximately 25% of the length of the slot-shaped opening 30. The distance between the left-side edge of the slot-shaped opening 30 and the rear wall 24 is less than 25% of the length of the slot-shaped opening 30. As a result, each of these distances is shorter than the length of the slot-shaped opening 30. A seal 31 is disposed on the upper side 21 so that it surrounds the edge of slot-shaped opening 30.

The chamber arrangement 10 further includes a carriage system 32. The carriage system 32 includes two supports 34, a carriage 36 and two linear guides 38. The supports 34 are rectangular box-shaped and have a length that corresponds to three-times the length of the slot-shaped opening 30. Consequently, in the mounted state, the supports 34 project in the direction of the longitudinal axis 15 considerably outwardly over the upper wall 20 and/or the upper side 21 beyond the rear wall 24 on one side and beyond the loading/unloading opening 26 on the opposite side. The supports 34 are disposed on the upper side 21 of the chamber housing 12 so that they mutually-oppose each other in a spaced, parallel relationship and they are parallel to the slot-shaped opening 30. The distance between each of the facing side surfaces of the supports 34 and the slot-shaped opening 30 is about twice the width of the slot-shaped opening 30. The linear guides 38 are formed as rails and have the same length as the supports 34. The linear guides 38 are disposed on the facing side surfaces of the supports 34.

The carriage 36 is disposed between the linear guides 38. The carriage 36 has a width that corresponds substantially to the spacing of the linear guides 38 and a length that is longer than twice the length of the slot-shaped opening 30. A round opening 40 is defined in the middle of the carriage 36. The round opening 40 has a diameter that is less than the width of the slot-shaped opening 30. The carriage 36 is disposed between the supports 34 so that it is linearly movable between and guided by the linear guides 38. The side of the carriage 36 that faces the chamber interior space 14 abuts on the seal 31. The opening 40 overlaps the slot-shaped opening 30 due to this spatial arrangement.

An electron beam generator 42 includes a beam nozzle 44 that is disposed on the lower side of the electron beam generator 42 and is fixedly connected with it. The electron beam generator 42 is disposed on the side of the carriage 36 that faces the chamber interior space 14 so that the beam nozzle 44 projects through the opening 40 and into the slot-shaped opening 30. Further, the electron beam generator 42 encloses the opening 40 in a pressure-tight manner. The electron beam generator 42 is adapted to generate an electron beam that propagates through the beam nozzle 44 along an electron beam axis 45 and into the chamber interior space 14.

During electron beam processing, a (not-shown) drive means moves the carriage 36 together with the electron beam generator 42 so that the electron beam can reach different positions within the chamber interior space 14. The geometric construction of the carriage 36 and the supports 34 enables the carriage 36 to abut on the seal 31 in every position and thus the chamber interior space 14 always remains sealed relative to the environment outside of the chamber arrangement 10 during an electron beam processing operation.

SUMMARY

It is an object of the invention to provide improved electron beam processing devices and improved methods for using the same.

In one aspect of the present teachings, the electron beam processing device preferably has a relatively compact arrangement for moving the electron beam generator.

In another aspect of the present teachings, a representative, non-limiting electron beam processing device preferably includes a chamber housing defining a chamber interior space and having a first opening. A carriage is movable along the first opening. An electron beam generator is adapted to generate an electron beam along an electron beam axis. The electron beam generator is disposed on the carriage so that the electron beam passes through the first opening when the carriage moves along the first opening. A disk is preferably disposed between the chamber housing and the carriage and is rotatable about a rotational axis, which is perpendicular to the first opening, at least between a first rotational position and a second rotational position of the disk. The disk has a second opening that preferably is displaced or offset from the rotational axis of the disk in the radial direction. The rotational axis of the disk is disposed so that the first opening overlaps the second opening at least along the electron beam axis when the disk rotates between the first rotational position and the second rotational position. With such an arrangement, it is possible to perform the electron beam processing while moving the carriage only within the horizontal outer dimensions of the chamber housing. Consequently, in this representative embodiment, the dimensions/lengths of guides for the carriage are not required to exceed the size and/or the horizontal dimensions of the chamber housing, thereby providing a compact device.

In another aspect of the present teachings, the first opening is circular so that the electron beam generator, combined with an X-Y carriage, is enabled to move the electron beam to every point within the plane of the first opening without deflection.

In another aspect of the present teachings, the first opening is slot-shaped so that an especially compact arrangement for moving the electron beam generator is possible.

In another aspect of the present teachings, the second opening is slot-shaped. The disk is preferably rotated by a beam nozzle of the electron beam generator, although the disk may instead be rotated, e.g., by a drive arrangement directly coupled to the disk.

In another aspect of the present teachings, a flange may be provided on the electron beam generator. In this case, a first seal may be provided between the flange and the disk so as to enclose the second opening and a second seal may be provided between the disk and the chamber housing so as to enclose the first opening. In this optional embodiment, the chamber interior space is sealed and/or closed relative to the environment outside of the chamber arrangement and the sealing can be achieved independent of the carriage.

In another aspect of the present teachings, the flange may be integrally formed with the carriage or the flange and the carriage may be two separate parts.

In another aspect of the present teachings, the carriage may comprise an X-Y carriage.

In another aspect of the present teachings, the electron beam generator includes a beam nozzle. Preferably, the beam nozzle is coupled to a drive arrangement and movement of the beam nozzle is adapted to rotate the disk. In this arrangement, the positioning and movement of the electron beam inside the chamber interior space can be very precise. In the alternative, the disk may be directly drivable or rotatable by a drive or motor. In this case, rotation of the disk causes the beam nozzle to move, which thereby causes the carriage to move.

In another aspect of the present teachings, the second opening has a length that is not longer than half of the length of the first opening plus the diameter of the beam nozzle of the electron beam generator. In this case, a larger spacing from the first opening for the rotational axis is possible, whereby the torque for rotating the disk can be increased.

In another aspect of the present teachings, the rotational axis of the disk does not extend through the second opening. In this case, the size of the surface of the second opening that must be sealed can be made smaller.

In another aspect of the present teachings, the electron beam processing device includes a support having parallel projections spaced from each other and the carriage is guided on two facing side surfaces of the projections. This embodiment provides an improved guidance system for the carriage.

In another aspect of the present teachings, a bearing rotatably bears or supports the disk. The bearing is preferably located between the support and an outer circumference of the disk, so that the disk is securely retained within the guide and is rotatable.

Further objects, advantages and utilities of the present teachings will become apparent from the description of the detailed embodiments with reference to the appended drawings.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved electron beam processing devices, as well as methods for using the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
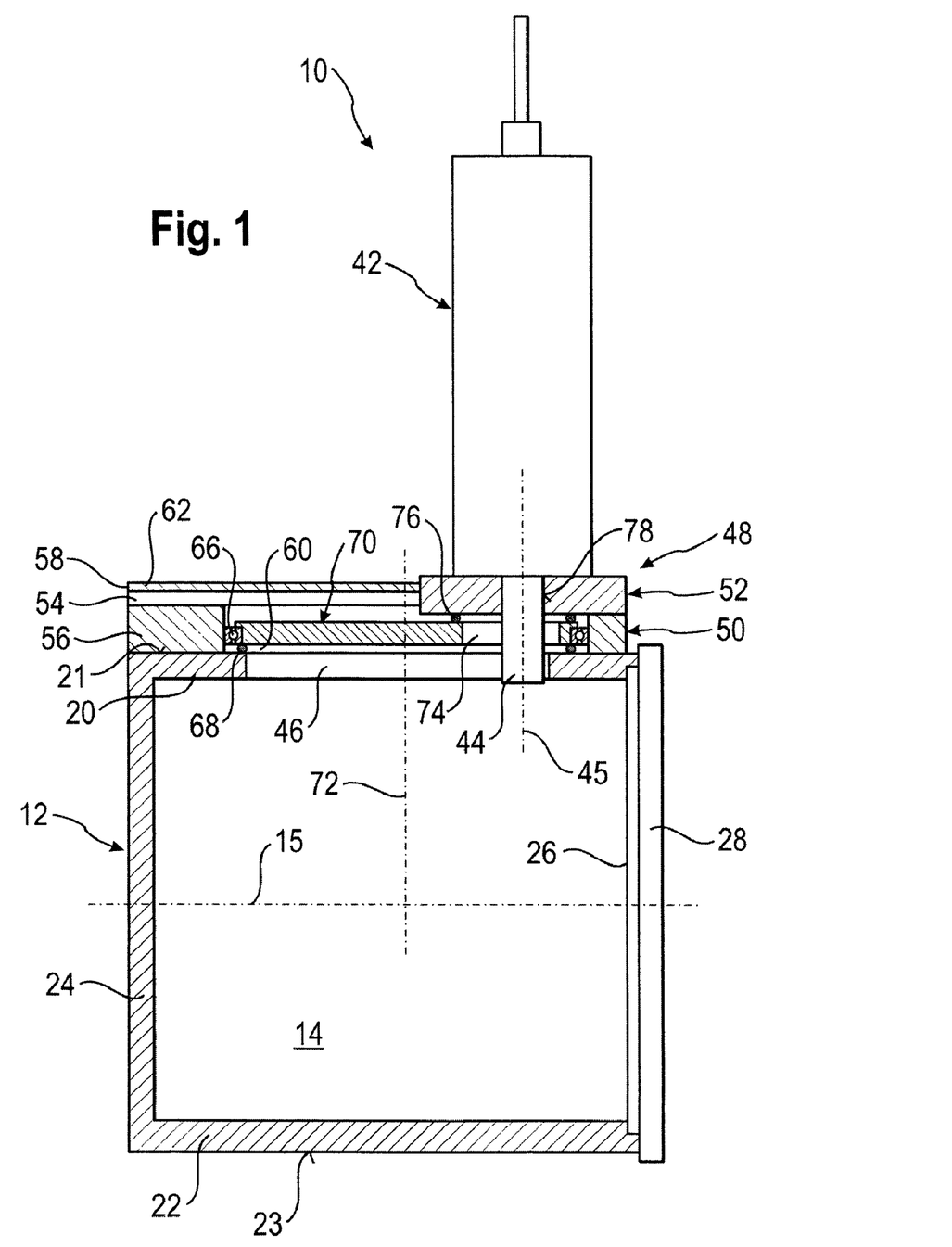
FIG. 1 shows a longitudinal view of an electron beam processing device according to a representative embodiment of the present teachings.
Figure 2:
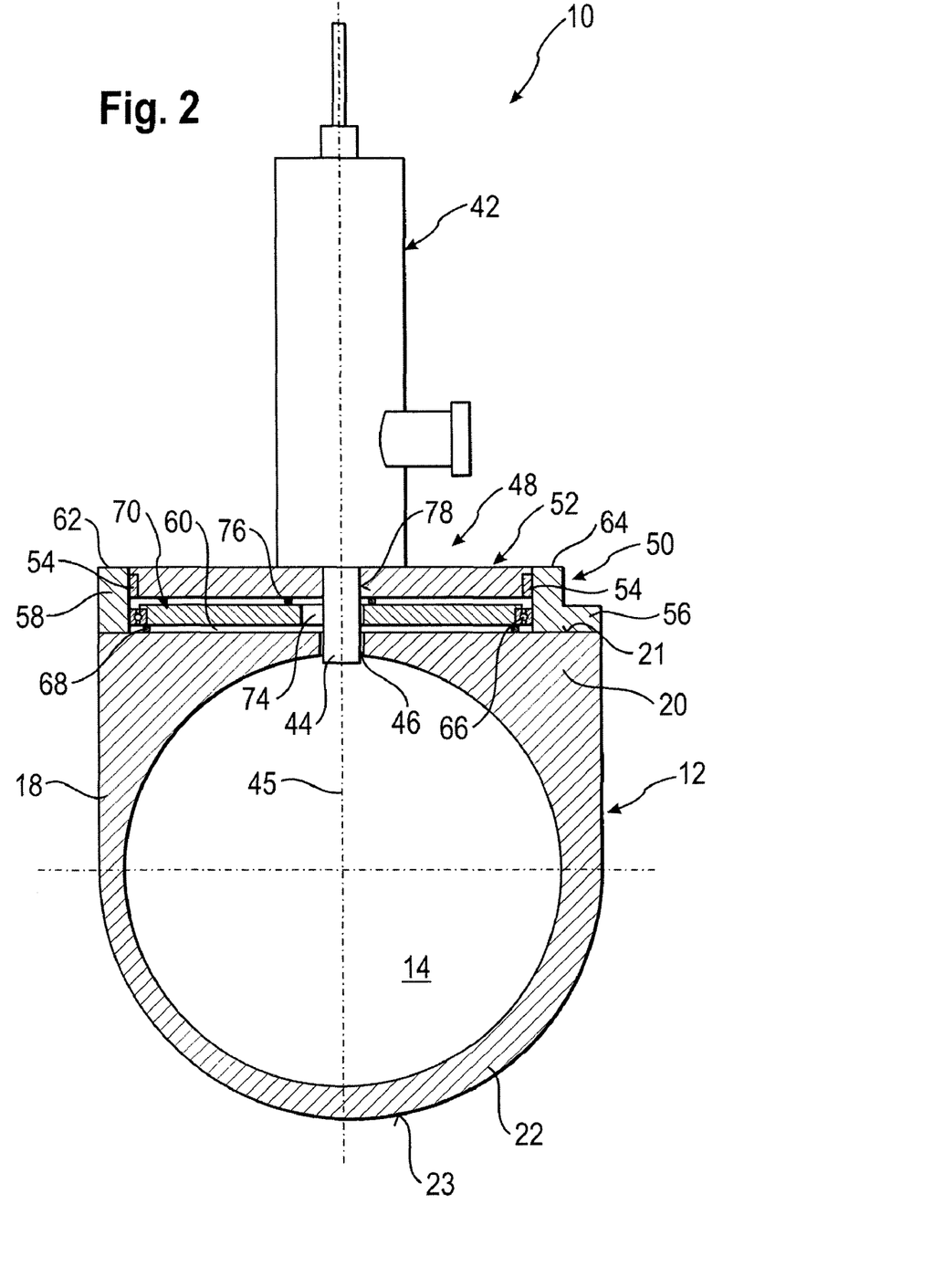
FIG. 2 shows a cross-sectional view of the electron beam processing device of FIG. 1.
Figure 3:
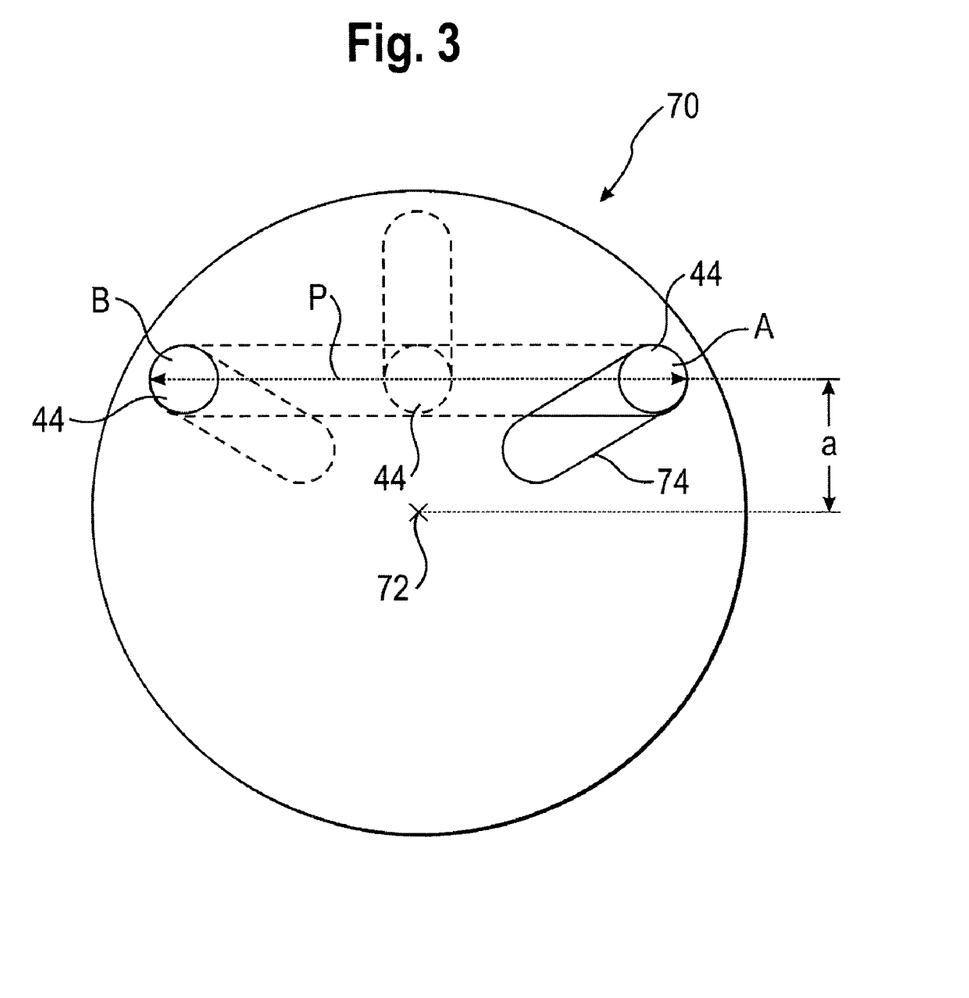
FIG. 3 shows an enlarged plan view of a disk of the electron beam processing device of FIG. 1.

FIGS. 1-3 show a chamber arrangement 10 of a representative, non-limiting electron beam processing device according to the present teachings. It is noted that components, which correspond to the components of the known electron beam processing device described above in connection with FIGS. 4 and 5, are denoted by the same reference numerals. Furthermore, the description of the above-described known electron beam processing device is hereby incorporated into the detailed description by reference as if fully set forth herein. Therefore, the following description will focus on the differences to the known electron beam processing device shown in FIGS. 4 and 5. For the rest, the description and illustrations of FIGS. 4 and 5 also apply to the description of the representative embodiment of FIGS. 1-3.

The upper side 21 of the chamber housing 12 is planar and a first slot-shaped opening 46 is defined in the middle of the upper side 21. The first slot-shaped opening 46 extends parallel to the longitudinal axis 15. As can be derived from the illustration of FIG. 1, the distance between the right-side edge of the first slot-shaped opening 46 and the loading/unloading opening 26 is about 25% of the length of the first slot-shaped opening 46 and the distance between the left-side edge of the first slot-shaped opening 46 and the rear wall 24 is likewise about 25% of the length of the first slot-shaped opening 46.

The chamber arrangement 10 further includes a carriage system 48. The carriage system 48 includes a support 50, a carriage 52 and two linear guides 54. The support 50 has a length that corresponds to the dimension or length of the upper side 21 in the direction of the longitudinal axis 15 (hereafter also 'the longitudinal direction'). The support 50 has a width that corresponds the dimension or length of the planar upper side 21 in a transverse direction that is perpendicular to the longitudinal axis 15. In the height or vertical direction, which is perpendicular to the longitudinal direction and the transverse direction, the support 50 has a lower portion 56 and an upper portion 58, which are integrally formed with each other. The lower portion 56 has a circular opening 60. The diameter of the opening 60 is larger than the length of the first slot-shaped opening 46. The upper portion 58 comprises two rectangular-box-shaped projections 62, 64 that mutually-oppose each other in a parallel-spaced relationship and extend over the entire length of the support 50. The distance between the facing side surfaces of the projections 62, 64 corresponds to the diameter of the opening 60. The middle line between the facing side surfaces of the projections 62, 64 goes through the middle point of the circular opening 60.

The support 50 is disposed on the upper side of the chamber housing 12 so that the projections 62, 64 are parallel to the first slot-shaped opening 46 and the middle line between the projections 62, 64 of the support 50 is not congruent with the middle line of the first slot-shaped opening 46 as viewed in the height direction. The middle point of the opening 60 is thus offset relative to the middle line of the support 50 by a distance a (see FIG. 3) in the transverse direction of the support 50. This distance a corresponds to approximately 1.5 times the width of the first slot-shaped opening 46. The linear guides 54 are formed as rails and have the same length as the projections 62, 64. The linear guides 54 are disposed on the facing side surfaces of the projections 62, 64. A bearing 66, which is formed as a ball bearing and has an outer diameter that is attuned or matched to the diameter of the opening 60, is disposed in the opening 60 so that the bearing 66 is attached to the edge of the opening 60. The bearing 66 is adapted to absorb forces that act in and/or against the height direction.

An electron beam generator 42 includes a beam nozzle 44 that is disposed on the lower side of the electron beam generator 42 and is fixedly connected with it.

A circular disk 70 has an outer diameter that substantially corresponds to or matches the inner diameter of the bearing 66. The disk 70 is disposed in the opening 60 so that it is rotatably borne about a rotational axis 72 via the bearing 66 disposed on its outer circumference. The side of the disk 70 facing the chamber interior space 14 abuts on the seal 68 disposed around the opening 60.

The rotational axis 72 extends in the height or vertical direction. The rotational axis 72 extends through the middle point of the opening 60 and through the middle line between the facing sides of the projections 62, 64. Consequently, the rotational axis 72 of the disk 70 is offset in the transverse direction relative to the longitudinal middle line of the first slot-shaped opening 46 by the distance a. The reason for this offset or displaced arrangement will be explained below in connection with a representative method of operating the electron beam processing device.

A second opening 74 is defined in the disk 70. The second opening 74 is formed in a slot-shaped manner and extends spaced or offset from the rotational axis 72 in the radial direction. Therefore, the rotational axis 72 also does not extend through the second slot-shaped opening 74. The second slot-shaped opening 74 has a length that is less than half of the length of the first slot-shaped opening 46 plus the diameter of the beam nozzle 44, and is preferably equal to half of the length of the first slot-shaped opening 46 plus the diameter of the beam nozzle 44 less the distance a. In this case, the outer portion of the second slot-shaped opening 74, as viewed in the radial direction of the disk 70, always overlaps the two end portions of the first slot-shaped opening 46 irrespective of the rotational position of the disk 70. A seal 76 is disposed on the side of the disk 70 that faces away from the chamber interior space 14 so that it encloses the entire periphery of the second slot-shaped opening 74.

The circular seal 68 has a diameter that is larger than the length of the first slot-shaped opening 46, but is less than the diameter of the disk 70, and is disposed on the upper side 21 of the chamber housing 12 enclosing the first slot-shaped opening 46, as was mentioned above. Consequently, the middle or center point of the seal 68, as viewed in the height direction, overlaps with the middle or center point of the opening 60. The bearing 66 absorbs the bulk of the force acting on the disk 70 that is generated by the pressure difference between the chamber interior space 14 and the outside world, so that the seal 68 is only required to absorb a small amount of this force.

A flange 52 is provided at the lower end of the electron beam generator 42 that faces the chamber interior space 14. The flange 52 encloses the beam nozzle 44 in a pressure-tight manner. The flange forms the carriage 52 in this representative embodiment.

The carriage/flange (hereinafter simply 'carriage') 52 has a width in the transverse direction that is attuned or matched to the spacing of the linear guides 54 and has a length in the longitudinal direction that is longer than twice the length of the second slot-shaped opening 74 less the diameter of the beam nozzle 44. A round opening 78 is defined in the middle of the carriage 52 and has a diameter that is less than the width of the second slot-shaped opening 74. The carriage 52 is disposed between the projections 62, 64 of the upper portion 56 of the support 60 so that it is linearly movable between and guided by the projections 62, 64 and abuts on the seal 76 as a flange. The carriage/flange 52 is thus also preferably borne so that the bulk of the force generated by the pressure difference is not absorbed by the seal 76, but rather by a (not-shown) bearing.

The electron beam generator 42 is disposed on the side of the carriage 52 facing away from the chamber interior space 14 so that the electron beam generator 42 is connected with the carriage 52 and encloses the opening 78 in a pressure-tight manner.

The beam nozzle 44 has a diameter that is less than the diameter of the opening 78 and less than the width of the two slot-shaped openings 46, 74. The beam nozzle 44 preferably projects from the lower side of the electron beam generator 42 by a length that is longer than the combined heights of the carriage 52, disk 70 and first slot-shaped opening 46 in the vertical direction, so that the beam nozzle 44 projects through the opening 78, through the second slot-shaped opening 74 and at least into the first slot-shaped opening 46.

The electron beam generator 42 is adapted to generate an electron beam that propagates through the beam nozzle 44 along an electron beam axis 45 and into the chamber interior space 14. The carriage 52 is preferably moved by a drive as will be described further below. The chamber interior space 14 is sealed relative to the outside environment and/or atmosphere by the seals 68, 70, the disk 70 and the carriage 52. In the illustrated embodiment, the beam nozzle 44 is inserted into the second slot-shaped opening 74 of the disk 70 without a clearance and the disk 70 is rotated about its rotational axis 72 by the movement of the beam nozzle 44.

The remaining elements of the electron beam processing device, such as e.g., an inlet/outlet opening for evacuating the chamber and for admitting fluid into the chamber, a pumping station, a deflecting coil, connections for the electron beam generator, drives for moving the carriage, etc., which are to be arranged on or in the chamber housing and/or the support, are well known to the skilled person, so that a detailed description of these elements is not required.

The chamber arrangement 10 disclosed above can modified in various ways without departing from the scope or spirit of the present invention. Representative, but not-limiting modifications include the following alternative representative embodiments.

The flange on the electron beam generator, which overlaps the second opening in the disk, can be formed separately from the carriage.

The bearing 66 can also be disposed, in alternative or in addition to the arrangement on the outer circumference of the disk 70 (or from the projection), between the disk 70 and the chamber housing 12.

The spacing between the ends of the first slot-shaped opening 46 and the rear wall 24 on the one side and the loading/unloading opening 26 on the other side, respectively, preferably falls in the range of 0 to 100% of the length of the first slot-shaped opening 46, more preferably in the range of 5 to 50%, and still more preferably in the range of 5 to 25%.

The distance a preferably falls in the range of 0 to half the radius of the disk 70.

The first opening 46 is not required to be formed in the upper wall 20 of the chamber housing 12, but rather can be formed in any wall of the chamber housing.

The first opening 46 is not required to be slot-shaped, but rather can have any outline or profile in plan view that falls within the seal 68 of the disk 70, such as e.g., circular, quadratic, rectangular, etc. It is also possible to provide more than one first opening.

The second opening 74 is also not required to be slot-shaped, but it is preferable.

Figure 6:
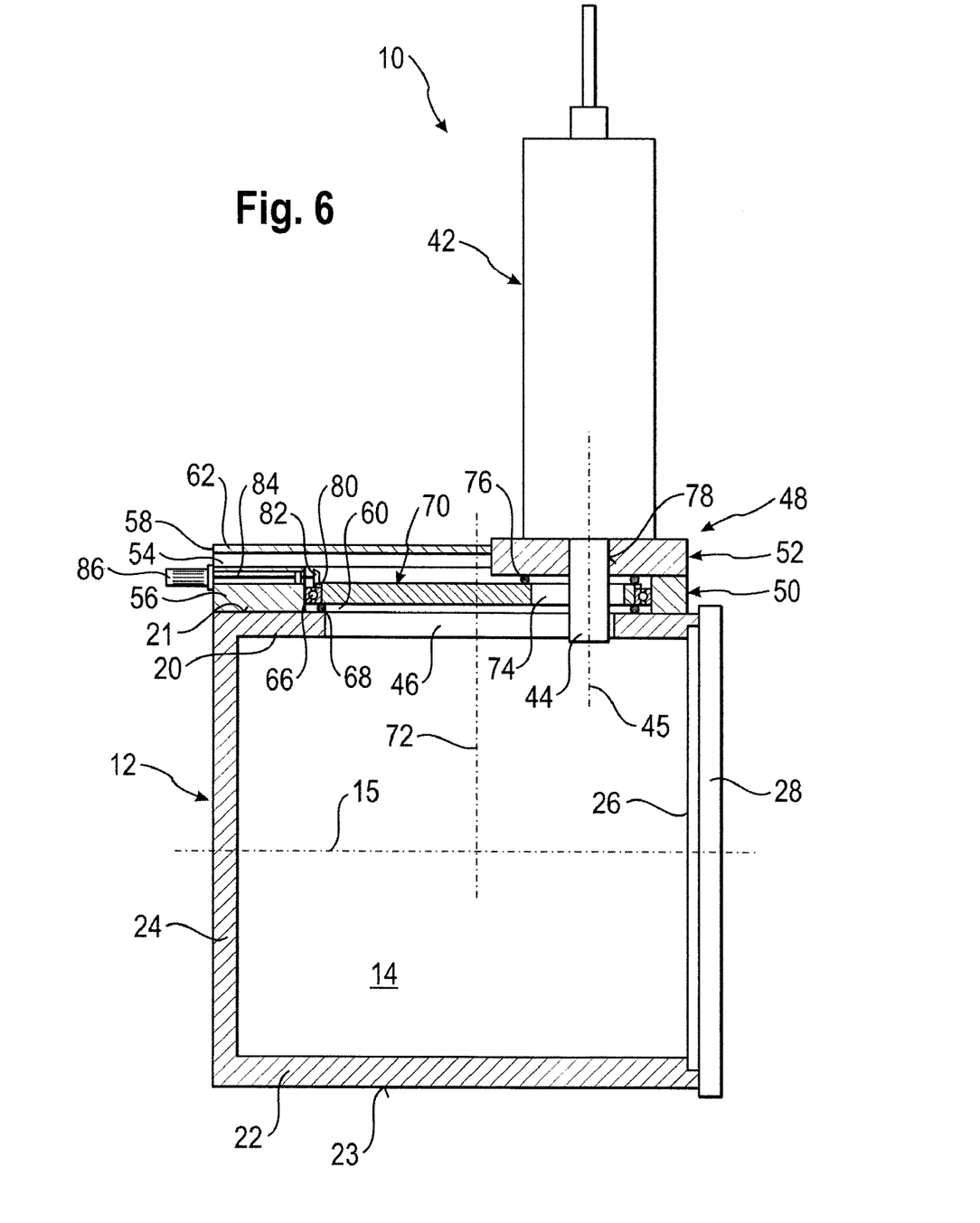
FIG. 6 shows an alternate embodiment of the electronic beam processing device of FIG. 1.

In addition or in the alternative, the disk 70 can be driven by its own drive. For example, as shown in FIG. 6, a gear ring 80 can be disposed on the outer circumference of the disk 70 between the bearing 66 and the carriage 52. A gear wheel 82 is attached to a motor 86 via a shaft 84 and the gear wheel 82 engages the gear ring 80. Rotation of the shaft 84 and gear wheel 82 causes the disk 70 to rotate about its rotational axis 72. In a further alternative (not-shown), the gear ring 80 could instead be disposed between the bearing 66 and the upper side 21 of the chamber housing 12. In either embodiment, when the disk 70 rotates, the edge of the second slot-shaped opening 74 presses against the beam nozzle 44 of the electron beam generator 42, thereby causing the carriage 52 to move together with beam nozzle 44.

As was mentioned above, the flange is, in the alternative, formed so as not to be integral with the carriage. This modification would make possible a so-called X-Y carriage, i.e. a carriage having two carriage parts that are movable perpendicular to each other. The X-Y carriage carries the electron beam generator such that the beam nozzle projects through the opening in the flange, through the second (slot-shaped) opening and into the first opening, so that an electron beam can propagate through the beam nozzle into the chamber interior space.

A construction of the second opening such that the beam nozzle can be moved in a position concentric to the rotational axis of the disk enables the electron beam generator, combined with the X-Y carriage, to move the beam nozzle to any point within the plane of the first opening without the carriage system projecting or extending over or outside the horizontal dimensions of the chamber housing, thereby providing a more compact arrangement as compared to the above-described known chamber arrangement.

The above-described decoupling of the carriage and the flange makes it possible to seal the chamber interior space relative to the outside environment and/or atmosphere by disposing seals between the chamber housing and the disk and between the disk and the flange independent of the carriage.

Because the torque for rotating the disk by means of the beam nozzle in the above-described embodiment decreases when the beam nozzle moves towards the rotational axis of the disk, in addition or in the alternative, a drive, such as a servo-drive, can be provided to rotate the disk. This is particularly advantageous if the second opening is sized such that the second opening subtends the rotational axis of the disk.

The loading/unloading opening can be provided on any side of the chamber housing. A plurality of loading/unloading openings can be disposed in any arbitrary positions on the chamber housing. The chamber housing can have any arbitrary form or shape. For example, the chamber housing can be formed as cube-shaped, box-shaped or spherical-shaped. It is sufficient if the chamber housing is constructed so that the support can be mounted on the side, on which the carriage system is to be disposed. This can be achieved, e.g., by providing an annular projection having a spherical shape. Instead of the seal around the edge of the loading/unloading opening, the seal can be attached to the door.

A representative method of operating the chamber arrangement 10 of the electron beam processing device will be described in the following with the assistance of FIGS. 1 to 3.

In the illustration of FIG. 1, the carriage 52 is located on the right side of the chamber housing 12, i.e. on the side of the loading/unloading opening 26. Consequently, the electron beam generator 42 with the beam nozzle 44 is on the right side of the first slot-shaped opening 46. This position corresponds to a first rotational position A of the carriage 52 as well as the disk 70, as indicted in FIG. 3.

During a processing operation, such as e.g., electron beam welding under vacuum and/or reduced pressure, which can be $10^{-1}$ mbar to $10^{-6}$ mbar in the described chamber arrangement 10 according to an embodiment of the invention, a motor or drive arrangement causes the carriage 52 to move towards the rear wall 24 (i.e. towards the left in FIG. 1). As a result, the carriage 52 moves together with the electron beam generator 42 towards the left in FIG. 1. Because the rotational axis 72 of the disk 70 is spaced from the first slot-shaped opening 46, the first slot-shaped opening 46 and the second slot-shaped opening 74 do not completely overlap, but rather overlap at least in the region of the electron beam axis 45 and/or in the region of the beam nozzle 44.

When the carriage 52 is moved, the beam nozzle 44 presses against the edge of the second slot-shaped opening 74 in the disk 70. Consequently, a torque acts about the rotational axis 72 of the disk 70, so that, when the carriage 52 moves towards the left in FIG. 1, the disk 70 rotates about the rotational axis 72 towards the left on the bearing 66. It therefore appears in the view of FIG. 3 that the beam nozzle 44 first moves radially inward in the second slot-shaped opening 74 and then moves radially outward, as is indicated by the different positions of the beam nozzle 44 in FIG. 3 during the movement of the carriage 52. In reality, the carriage 52 moves linearly towards the left and rotates the disk 70 with the assistance of the beam nozzle 44, so that the second slot-shaped opening 74 moves relative to the beam nozzle 44.

Thus, when the carriage 52 moves, the disk 70 is moved by the beam nozzle 44 together with it and/or is rotated together with it. By directly moving the carriage 52 using the drive, the carriage can be precisely positioned so that a high positional precision for the electron beam is possible.

If the carriage 52 is moved completely to the left according to the view of FIG. 1, the disk 70 is located in a second rotational position B. In this position B, the beam nozzle 44 is located leftward in the second slot-shaped opening 74. It is understood that the carriage 52 can also be moved in reverse, i.e. from left to right in the illustration of FIG. 1. A reciprocating movement is also possible as is indicated by a dotted double arrow P in FIG. 3.

REFERENCE NUMBER LIST 10 chamber arrangement
12 chamber housing
14 chamber interior space
15 longitudinal axis
16 side wall
18 side wall
20 upper wall
21 upper side
22 lower wall
23 lower side
24 rear wall
26 loading/unloading opening
28 door
30 slot-shaped opening
31 seal
32 carriage system
34 support
36 carriage
38 linear guide
40 opening
42 electron beam generator
44 beam nozzle
45 electron beam axis
46 first opening
48 carriage system
50 support
52 carriage
54 linear guide
56 lower portion
58 upper portion
60 opening
62 projection
64 projection
66 bearing
68 seal
70 disk
72 rotational axis
74 second opening
76 seal
78 opening
80 gear ring
82 gear wheel
84 shaft
86 motor
A first position
B second position
P double arrow

The invention claimed is:

1. An electron beam processing device comprising:
a chamber housing defining a chamber interior space and having a first opening,
a carriage movable along the first opening,
an electron beam generator disposed on the carriage such that an electron beam generated thereby passes through the first opening when the carriage moves along the first opening, and
a disk disposed between the chamber housing and the carriage, the disk being rotatable about a rotational axis, which is perpendicular to the first opening, at least between a first rotational position and a second rotational position, wherein a second opening is defined in the disk and extends radially spaced from the rotational axis of the disk, wherein the rotational axis of the disk does not extend through the second opening, and wherein the rotational axis of the disk is stationary relative to the chamber housing during rotation between the first and second rotational positions and is disposed such that the first opening overlaps the second opening at least along an electron beam propagation axis when the disk rotates between the first rotational position and the second rotational position.

2. An electron beam processing device according to claim 1, wherein the first opening is circular.

3. An electron beam processing device according to claim 1, wherein the first opening is slot-shaped.

4. An electron beam processing device according to claim 3, wherein the second opening is slot-shaped.

5. An electron beam processing device according to claim 4, further comprising:
a flange disposed on or extending from the electron beam generator,
a first seal disposed between the flange and the disk so as to enclose the second opening and
a second seal disposed between the disk and the chamber housing so as to enclose the first opening.

6. An electron beam processing device according to claim 1, wherein the carriage comprises an X-Y carriage.

7. An electron beam processing device according to claim 4, wherein the electron beam generator includes a beam nozzle and the disk is configured to be rotatable by moving the beam nozzle.

8. An electron beam processing device according to claim 1, further comprising a bearing rotatably supporting the disk, the bearing being disposed so as to radially surround an outer circumference of the disk and also being disposed within a circular portion of a support configured to linearly guide the carriage relative to the chamber housing, the support being immovable relative to the chamber housing.

9. An electron beam processing device according to claim 4, wherein the second opening has a length that is less than half the length of the first opening plus the diameter of a beam nozzle coupled to the electron beam generator.

10. An electron beam processing device according to claim 1, wherein the carriage is configured to linearly move relative to the chamber housing without rotating relative to the chamber housing.

11. An electron beam processing device according to claim 10, further comprising a support having parallel, spaced-apart projections, wherein the carriage is linearly guided by the projections.

12. An electron beam processing device according to claim 11, wherein the support is immovable relative to the chamber housing and the disk is rotatable relative to the carriage.

13. An electron beam processing device according to claim 1, wherein the electron beam generator includes a beam nozzle, the disk is configured to be rotatable by movement of the beam nozzle and the second opening has a length that is less than half the length of the first opening plus the diameter of the beam nozzle.

14. An electron beam processing device according to claim 1, further comprising a support having parallel, spaced-apart projections, wherein the carriage is guided on two facing side surfaces of the projections and the horizontal dimensions of the projections do not exceed the horizontal dimensions of the chamber housing.

15. An electron beam processing device comprising:
a chamber housing defining a chamber interior space and having a first opening,
a carriage movable along the first opening,
an electron beam generator disposed on the carriage such that an electron beam generated thereby propagates through the first opening along an electron beam propagation axis, and
a circular disk disposed between the chamber housing and the carriage, the disk being rotatable about a stationary rotational axis at least between a first rotational position and a second rotational position, wherein a second opening is defined in the disk and has an elongated shape that does not encompass the rotational axis of the disk, and wherein the first opening overlaps the second opening at least along the electron beam propagation axis at all rotational positions of the disk.

16. An electron beam processing device according to claim 15, wherein the carriage is linearly movable relative to the chamber housing without rotating relative to the chamber housing and the disk is rotatable relative to the carriage.

17. An electron beam processing device according to claim 16, further comprising a support having parallel, spaced-apart projections that are immovable relative to the chamber housing, wherein the carriage is linearly guided by the projections.

18. An electron beam processing device comprising:
a chamber housing defining a chamber interior space and having a first opening,
a carriage linearly movable relative to the chamber housing,
an electron beam generator disposed on the carriage such that an electron beam generated thereby propagates through the first opening along an electron beam propagation axis, and
a circular disk disposed between the chamber housing and the carriage, the disk being rotatable relative to the chamber housing and relative to the carriage about a stationary rotational axis at least between a first rotational position and a second rotational position, wherein a second opening having an elongated shape is defined in the disk and the first opening overlaps the second opening at least along the electron beam propagation axis at all rotational positions of the disk.

19. An electron beam processing device comprising:
a chamber housing defining a chamber interior space and having a first opening, wherein the first opening is slot-shaped,
a carriage movable along the first opening,
an electron beam generator disposed on the carriage such that an electron beam generated thereby passes through the first opening when the carriage moves along the first opening, and
a disk disposed between the chamber housing and the carriage, the disk being rotatable about a rotational axis, which is perpendicular to the first opening, at least between a first rotational position and a second rotational position, wherein a second opening is defined in the disk and extends radially spaced from the rotational axis of the disk and wherein the rotational axis of the disk is stationary relative to the chamber housing during rotation between the first and second rotational positions and is disposed such that the first opening overlaps the second opening at least along an electron beam propagation axis when the disk rotates between the first rotational position and the second rotational position.

20. An electron beam processing device according to claim 19, further comprising a support having parallel, spaced-apart projections that are immovable relative to the chamber housing, wherein the carriage is linearly guided by the projections relative to the chamber housing without rotating relative to the chamber housing and the disk is rotatable relative to the carriage.

* * * * *